United States Patent [19]

Ogawa

[11] Patent Number: 4,716,441
[45] Date of Patent: Dec. 29, 1987

[54] LIGHT EXPOSURE APPARATUS

[75] Inventor: Kazufumi Ogawa, Hirakata, Japan

[73] Assignee: Matsushita Electric Industrial Co., Ltd., Kadoma, Japan

[21] Appl. No.: 886,662

[22] Filed: Jul. 16, 1986

[30] Foreign Application Priority Data

Jul. 19, 1985 [JP] Japan .................. 60-160508

[51] Int. Cl.$^4$ ............................. G03B 27/52
[52] U.S. Cl. ...................... 355/30; 355/52; 355/53
[58] Field of Search ............... 355/30, 52, 53

[56] References Cited

U.S. PATENT DOCUMENTS 3,539,256 11/1970 Ables .................................. 355/53

FOREIGN PATENT DOCUMENTS 60-79357 7/1985 Japan .................................. 355/30
60-79358 7/1985 Japan .................................. 355/30

OTHER PUBLICATIONS

*Popular Science* May, 1983, Article entitled "Square Blue Laser".

Primary Examiner—Monroe H. Hayes
Attorney, Agent, or Firm—Wenderoth, Lind & Ponack

[57] ABSTRACT

Disclosed is a light exposure apparatus which has a light source, a light exposure optical system, an alignment optical system and a box, the interior of which is at a reduced pressure in which the exposure light path and alignment light path are at least in part disposed. Thereby, higher pattern resolution and more precise alignment can be obtained.

5 Claims, 1 Drawing Figure

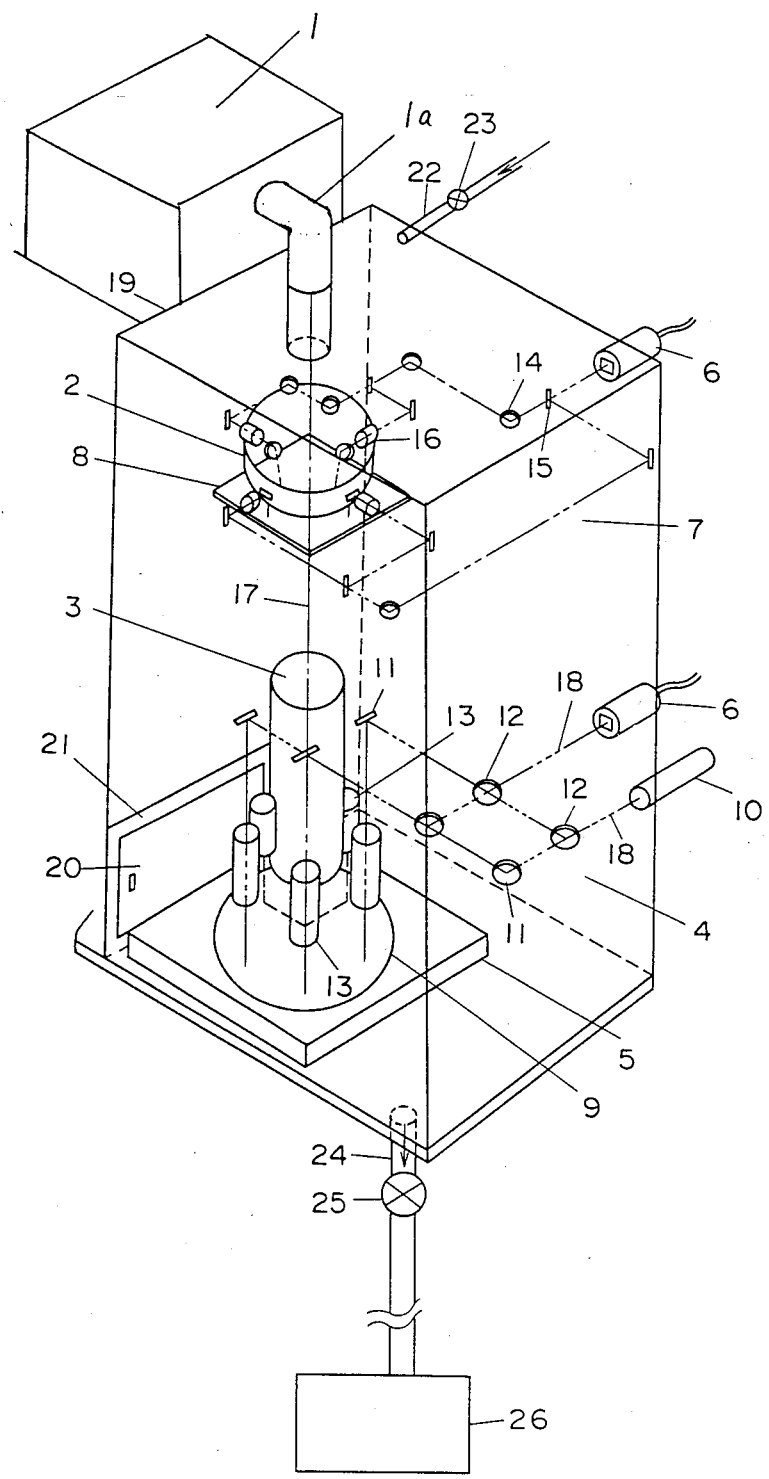

LIGHT EXPOSURE APPARATUS

BACKGROUND OF THE INVENTION

This invention relates to a light exposure apparatus which is used in manufacturing semiconductor integrated circuits (IC), and more particularly relates to a light exposure apparatus which is used for forming super minute patterns and used for a photolithography process in manufacturing ultra large scale integrated circuits (ULSI).

At present, a light exposure apparatus is generally used in a photolithography process for IC manufacture, and an electron beam exposure apparatus is used for manufacturing photomasks etc. Further, considering the possible advent of devices of further higher density and larger scale integration, a direct writing method is being studied which uses an electron beam and X-ray exposure method.

The electron beam exposure method has some drawbacks that throughput is not so good although it is easy to form minute patterns. The X-ray exposure method obtains not-so-bad throughput by use of SOR-X-ray source etc., but has some drawbacks with the alignment system so that it has not yet been used in practice.

On the other hand, conventional light exposure apparatus obtains a high rate of throughput, but, since it uses g-rays or i-rays of an ultra high pressure mercury lamp and there occurs a decrease of resolution by light diffraction and interference, the pattern forming is limited to approximately 1 $\mu$m.

To achieve a more minute pattern, i.e., a pattern of less than 1 $\mu$m, the development of a light exposure apparatus has been carried out, which apparatus uses a light of lower wavelength such as an eximer laser [for example, XeCl (308 nm), KrF (248 nm), ArF (193 nm)]. In such case, if such lower wavelength light enables more minute pattern resolution, it necessarily requires an increase in the preciseness of alignment to reduce the distortion of patterns. For example, alignment preciseness of 0.05 $\mu$m is required to achieve a pattern of 0.5 $\mu$m. However, it is difficult to accomplish this requirement at the present time.

SUMMARY OF THE INVENTION

The present invention, therefore, has as its principal object the provision of a light exposure apparatus which can realize higher resolution patterns and more precise alignment.

These and other objects are accomplished by a light exposure apparatus which comprises at least a light source, a lens, a photomask holder, a wafer holder, and an alignment optical system, an exposure light path and an alignment light path being in part disposed in a box of reduced pressure from which air is exhausted.

In a specific embodiment, the wave length of the light source includes the ultraviolet region or far ultraviolet region. As the light source, an eximer laser, which generates ultraviolet light of 193, 246 or 308 nm, is used. According to the present invention as described herein, the following benefits, among others, are obtained:

The light exposure apparatus of the present invention may completely prevent the occurrence of possible air flow and uneven density in the light path. Therefore, it prevents alignment errors which occur due to air movement which causes swinging of the light path so that it enables the manufacture of semiconductor integrated circuits of more large scale integration and higher density.

While the novel features of the invention are set forth with particularly in the appended claims, the invention both as to organization and content, will be better understood and appreciated, along with other objects and features thereof, from the following detailed description taken in conjunction with the drawing, in which:

BRIEF DESCRIPTION OF THE DRAWINGS

The FIGURE is a schematic perspective view showing one embodiment of an exposure apparatus according to the invention.

DETAILED DESCRIPTION OF THE INVENTION

In the FIGURE attached hereto, a reduction projection type light exposure apparatus is disclosed. The apparatus includes an eximer laser 1 as light source [XeCl (wave length=308 nm), KrF (249 nm), ArF 193 nm) etc.], condensor lens 2, reduction projection lens 3, wafer alignment optical system 4, XY stage 5, ITV camera 6, reticle alignment optical system 7, reticle 8, wafer 9, laser 10 for alignment use and so on. The wafer alignment optical system 4 includes mirrors 11, half mirrors 12 and lenses 13. The reticle alignment optical system 7 includes mirrors 14, half mirrors 15 and lenses 16. As is apparent from the FIGURE, exposure light path 17 and alignment light path 18 are at least in part disposed in a box 19.

That is, lenses 2 and 3, X-Y stage 5, reticle 8, wafer 9, mirrors 11, 12, 14, 15, and lenses 13 and 16 are disposed in box 19. Lasers 1 and 10 and ITV cameras 6 are disposed outside and proximate the box 19.

That is, laser 1 is connected to the top surface of the box 19 through waveguide 1a. Laser 10 is disposed on the side surface of the box 19. Cameras 6 are also disposed on the side surface of the box 19.

The box 19 may be made of transparent plastic resin or metals. The box 19 has door 20 which is surrounded by a rubber ring 21 for hermetical sealing. When door 20 is opened, wafer 9 can be inserted into the box 19 through door opening and mounted on X-Y stage 5.

The box 19 has air inlet 22 on its upper side. A valve 23 is used for opening and shutting the inlet 22. The box 19 also has air outlet 24 on its bottom corner portion. A valve 25 is used for opening and shutting the outlet 24. The outlet 24 is connected to exhaust apparatus 26 (e.g., vacuum pump).

In operation, resist-coated-wafer 9 is inserted into the box 19 and door 20 is shut to close the door opening. With valve 23 is closed, valve 25 is opened and exhaust apparatus 26 is operated to thereby exhaust air from inside of the box 19. Thereby, the inside of the box 19 is placed under reduced pressure of approximately 2-3 torr. Under such condition, alignment operation and light exposure operation are carried out. To release the reduced pressure, valve 23 is opened to introduce air into the box 19.

While a specific embodiment of the invention has been illustrated and described herein, it is realized that other modifications and changes will occur to those skilled in the art. It is therefore to be understood that the appended claims are intended to cover all modifications and changes as fall within the true spirit and scope of the invention.

What I claim is:

1. A light exposure apparatus comprising:

an exposure light source for generating light of a wavelength in the far ultraviolet wavelength region;

a light exposure optical system for receiving and passing light from said light source therethrough along an exposure light path;

an alignment optical system operatively associated with said light exposure optical system for aligning said light exposure optical system and including means for directing light along an alignment light path;

a box in which said exposure light path and said alignment light path are at least in part disposed;

an air inlet means in said box for introducing air into the inside of said box;

first means for opening and shutting said air inlet means;

an air outlet means in said box for exhausting air from the inside of said box;

second means for opening and shutting said air outlet means; and exhaust means coupled to said air outlet means through said second means for exhausting the interior of said box to a subatmospheric pressure;

whereby said air inlet means can be closed and said air outlet means opened and said exhaust means can be operated to exhaust air from the interior of said box so that the inside of said box is at a subatmospheric pressure.

2. The light exposure apparatus as claimed in claim 1 in which said light source is an eximer laser.

3. The light exposure apparatus as claimed in claim 2 in which said eximer laser is a KrF eximer laser.

4. The light exposure apparatus as claimed in claim 2 in which said eximer laser is a XeCl eximer laser.

5. The light exposure apparatus as claimed in claim 2 in which said eximer laser is a ArF eximer laser.

* * * * *